United States Patent
Feng et al.

(10) Patent No.: US 10,374,545 B2
(45) Date of Patent: Aug. 6, 2019

(54) ROTOR TEMPERATURE MONITORING METHOD AND SYSTEM FOR PERMANENT MAGNET SYNCHRONOUS MOTOR

(71) Applicant: CRRC ZHUZHOU ELECTRIC LOCOMOTIVE RESEARCH INSTITUTE CO., LTD., Zhuzhou, Hunan (CN)

(72) Inventors: Jianghua Feng, Hunan (CN); Jing Shang, Hunan (CN); Junfeng Xu, Hunan (CN); Yuliang Wen, Hunan (CN); Xiong Liu, Hunan (CN); Chaoyang Zhang, Hunan (CN); Lei Xiao, Hunan (CN); Yaping He, Hunan (CN); Yonghui Nan, Hunan (CN); Hanfeng Zheng, Hunan (CN)

(73) Assignee: CRRC ZHUZHOU ELECTRIC LOCOMOTIVE RESEARCH INSTITUTE CO., LTD., Hunan (CN)

( * ) Notice: Subject to any disclaimer, the term of this patent is extended or adjusted under 35 U.S.C. 154(b) by 151 days.

(21) Appl. No.: 15/507,459

(22) PCT Filed: Sep. 2, 2015

(86) PCT No.: PCT/CN2015/088807
§ 371 (c)(1),
(2) Date: Feb. 28, 2017

(87) PCT Pub. No.: WO2016/034114
PCT Pub. Date: Mar. 10, 2016

(65) Prior Publication Data
US 2017/0338765 A1    Nov. 23, 2017

(30) Foreign Application Priority Data

Sep. 5, 2014 (CN) .......................... 2014 1 0452142

(51) Int. Cl.
*H02P 6/08* (2016.01)
*G01K 13/08* (2006.01)
(Continued)

(52) U.S. Cl.
CPC ............ *H02P 29/662* (2016.11); *G01K 7/427* (2013.01); *G01K 13/08* (2013.01); *G01R 31/343* (2013.01);
(Continued)

(58) Field of Classification Search
CPC .... H02P 29/67; H02P 6/08; H02P 9/40; H02P 29/62; H02P 2207/05; G01K 7/00; G01K 13/08
See application file for complete search history.

(56) References Cited

U.S. PATENT DOCUMENTS 9,383,265 B2 * 7/2016 Dib .......................... G01K 7/16
2007/0070560 A1    3/2007 Hikawa et al.
(Continued)

FOREIGN PATENT DOCUMENTS

CN    101769797 A    7/2010
CN    102072778 A    5/2011
(Continued)

OTHER PUBLICATIONS

International Search Report corresponding to Application No. PCT/CN2015/088807; dated Dec. 11, 2015, with English translation.
(Continued)

*Primary Examiner* — Eduardo Colon Santana
*Assistant Examiner* — Said Bouziane
(74) *Attorney, Agent, or Firm* — Cantor Colburn LLP

(57) ABSTRACT

A rotor temperature monitoring method and system for a permanent magnet synchronous motor are provided. According to the method and system, an a-phase line current and a b-phase line current of a stator of a permanent magnet (Continued)

synchronous motor are obtained as a first line current and a second line current; further, a line voltage between the a-phase and the b-phase of the stator is obtained and a rotating speed of the rotor of the permanent magnet synchronous motor is obtained; and then, the first line current, the second line current, the line voltage, the rotating speed of the rotor, an inductance parameter of the permanent magnet synchronous motor and a temperature characteristic equation of a permanent magnet of the rotor are substituted into a preset rotor permanent magnet temperature expression to calculate and obtain the temperature of the rotor.

8 Claims, 3 Drawing Sheets

(51) Int. Cl.
*G01R 31/34* (2006.01)
*H02K 21/00* (2006.01)
*G01K 7/42* (2006.01)
*H02P 29/60* (2016.01)
*H02P 29/66* (2016.01)

(52) U.S. Cl.
CPC ............... *H02P 6/08* (2013.01); *H02P 29/67* (2016.11); *H02K 21/00* (2013.01); *H02K 2211/00* (2013.01); *H02P 29/66* (2016.02); *H02P 2207/05* (2013.01)

(56) References Cited

U.S. PATENT DOCUMENTS

| | | | |
|---|---|---|---|
| 2010/0276929 A1 | 11/2010 | Jansen | |
| 2011/0144843 A1* | 6/2011 | Wu | B60L 15/025 701/22 |
| 2011/0181217 A1 | 7/2011 | Vollmer et al. | |
| 2015/0137720 A1* | 5/2015 | Kobayashi | H02P 21/141 318/400.15 |
| 2016/0091568 A1* | 3/2016 | Weber | G01R 31/343 318/490 |

FOREIGN PATENT DOCUMENTS

| | | |
|---|---|---|
| CN | 102710208 A | 10/2012 |
| CN | 103888041 A | 6/2014 |
| CN | 104158463 A | 11/2014 |
| WO | 2005041397 A1 | 5/2005 |
| WO | 2014041422 A2 | 3/2014 |

OTHER PUBLICATIONS

Jingguo Che et al, "Analysis of Temperature Effect in Direct Torque Control System for Permanent Magnet Synchronous Motor" Machine Tool & Hydraulics, China Academic Journal Electronic Publishing House, Aug. 2013, vol. 41 No. 15, 4 pages.

Extended European Search Report for corresponding EP Application No. 15838205.1-1202/3190697 PCT/CN2015/088807; dated Jan. 17, 2018.

* cited by examiner

ROTOR TEMPERATURE MONITORING METHOD AND SYSTEM FOR PERMANENT MAGNET SYNCHRONOUS MOTOR

The present application is the national phase of International Patent Application No. PCT/CN2015/088807, titled "ROTOR TEMPERATURE MONITORING METHOD AND SYSTEM FOR PERMANENT MAGNET SYNCHRONOUS MOTOR", filed on Sep. 2, 2015, which claims priority to Chinese Patent Application No. 201410452142.1, entitled "ROTOR TEMPERATURE MONITORING METHOD AND SYSTEM FOR PERMANENT MAGNET SYNCHRONOUS MOTOR", filed on Sep. 5, 2014 with the State Intellectual Property Office of People's Republic of China, both of which are incorporated herein by reference in their entireties.

BACKGROUND

In an existing permanent magnet synchronous motor, it is necessary to provide a temperature sensor to monitor a temperature of the motor. Different permanent magnet materials have different temperature characteristics, and in general, magnetic field intensity of a permanent magnet weakens linearly as temperature increases, and enhances linearly as the temperature decreases. The magnetic field intensity of the permanent magnet always changes linearly in a certain range of the temperature. However, the magnetic field intensity of the permanent magnet reduces sharply and even the permanent magnet loses magnetism in a case that the temperature is exceed a critical temperature (also referred to as the Curie temperature). This process is irreversible, that is, the magnetic field intensity of the permanent magnet will not recover even if the temperature is reduced to be lower than the Curie temperature, and the permanent magnet has suffered irreversible damage, which is the reason for monitoring a temperature of a permanent magnet in a rotor of the permanent magnet motor in a real-time manner, in order to protect the rotor of the permanent magnet motor. The objective of monitoring the temperature of the motor is to, in a first aspect, protect the permanent magnet from losing magnetism due to a high temperature of the motor, and in a second aspect, derive a change in magnetic linkage of the permanent magnet, so as to correct torque output of the permanent magnet motor by compensating a magnetic linkage parameter of the permanent magnet.

However, some problems are caused by the temperature sensor installed in the existing permanent magnet synchronous motor. That is, by using a dedicated temperature sensor, not only system cost is increased, but also system fault points are added, which decreases the system reliability.

In addition, the temperature sensor can be installed only in a stator core of the permanent magnet motor, and there is time delay of thermal conduction between the rotor and the stator core. Therefore, protection for the permanent magnet and compensation for the magnetic linkage parameter cannot be timely and accurate.

SUMMARY

In view of the above, a method for monitoring a temperature of a rotor of a permanent magnet synchronous motor is provided according to the present disclosure, to monitor the temperature of the rotor of the permanent magnet synchronous motor, so as to avoid a problem of low system reliability due to the configuration of the temperature sensor to monitor the temperature of the rotor of the motor.

In order to realize the objective described above, a solution is provided as follows.

A method for monitoring a temperature of a rotor of a permanent magnet synchronous motor is provided, which includes: acquiring an a-phase line current of a stator of the permanent magnet synchronous motor as a first line current; acquiring a b-phase line current of the stator as a second line current; acquiring a line voltage between the a-phase and the b-phase of the stator; acquiring a rotating speed of the rotor of the permanent magnet synchronous motor; substituting the first line current, the second line current, the line voltage, the rotating speed, an inductance parameter of the permanent magnet synchronous motor and a temperature characteristic equation of a permanent magnet of the rotor into a preset rotor temperature expression, to calculate the temperature of the rotor.

Preferably, the temperature characteristic equation is acquired by steps of: measuring and recording a current ambient temperature as a first rotor temperature under a condition that the permanent magnet synchronous motor is in a complete cold state; dragging the permanent magnet synchronous motor to a rated rotating speed in an open-circuit state, and measuring a line voltage of the permanent magnet synchronous motor as a first line voltage; running the permanent magnet synchronous motor to rated power, and measuring a temperature of the stator of the permanent magnet synchronous motor as a second rotor temperature after the temperature of the permanent magnet synchronous motor is stable; after measuring the second rotor temperature, making the permanent magnet synchronous motor unloaded and keeping the permanent magnet synchronous motor running at a rated rotating speed, and measuring a line voltage of the permanent magnet synchronous motor as a second line voltage; and deriving the temperature characteristic equation from the first rotator temperature, the first line voltage, the second rotator temperature, the second line voltage and the rated rotating speed.

Preferably, the running the permanent magnet synchronous motor to rated power and measuring the temperature of the stator of the permanent magnet synchronous motor as the second rotor temperature after the temperature of the permanent magnet synchronous motor is stable includes: running the permanent magnet synchronous motor at the rated power, and measuring, by a temperature sensor pre-embedded in a stator core of the permanent magnet synchronous motor, a temperature of the stator as the second rotor temperature after the temperature of the permanent magnet synchronous motor is stable.

Preferably, the deriving the rotor temperature expression from the first rotator temperature, the first line voltage, the second rotator temperature, the second line voltage and the rated rotating speed includes: calculating a magnetic linkage expression of the permanent magnet of the permanent magnet synchronous motor based on the first rotator temperature, the first line voltage, the second rotator temperature, the second line voltage and the rated rotating speed; calculating magnetic linkage of the permanent magnet at zero degree centigrade according to the magnetic linkage expression; and calculating the rotor temperature expression based on the magnetic linkage expression and the magnetic linkage of the permanent magnet.

Preferably, the calculating the rotor temperature expression based on the magnetic linkage expression and the magnetic linkage of the permanent magnet includes: transforming a line voltage expression into a stationary two-phase voltage expression in a stationary two-phase α-β coordinate system; defining an extended back electromotive force expression; substituting the extended back electromotive force expression into the stationary two-phase voltage expression, and acquiring a magnetic linkage expression of the permanent magnet of the rotor by transformation; and substituting the magnetic linkage of the permanent magnet into the magnetic linkage expression of the permanent magnet to acquire the rotor temperature expression.

A system for monitoring a temperature of a rotor of a permanent magnet synchronous motor is provided, which includes: a first acquisition module configured to acquire an a-phase line current of a stator of the permanent magnet synchronous motor as a first line current; a second acquisition module configured to acquire a b-phase line current of the stator as a second line current; a third acquisition module configured to acquire a line voltage between the a-phase and the b-phase of the stator; a fourth acquisition module configure to acquire a rotating speed of the rotor of the permanent magnet synchronous motor; and a calculation and derivation module configured to substitute the first line current, the second line current, the line voltage, the rotating speed, an inductance parameter of the permanent magnet synchronous motor and a temperature characteristic equation of a permanent magnet of the rotor into a preset rotor temperature expression, to calculate the temperature of the rotor.

Preferably, the calculation and derivation module includes: a first detection unit, a second detection unit and a logic operation unit. The first detection unit is configured to measure and record a current ambient temperature as a first rotor temperature under a condition that the permanent magnet synchronous motor is in a complete cold state; the second detection unit is configured to drag the permanent magnet synchronous motor to a rated rotating speed in an open-circuit state, and measure a line voltage of the permanent magnet synchronous motor as a first line voltage; the first detection unit is further configured to run the permanent magnet synchronous motor to rated power, and measure a temperature of the stator of the permanent magnet synchronous motor as a second rotor temperature after the temperature of the permanent magnet synchronous motor is stable; the second detection unit is further configured to, after the permanent magnet synchronous motor runs at the rated power, make the permanent magnet synchronous motor unloaded and keep the permanent magnet synchronous motor running at a rated rotating speed, and measure a line voltage of the permanent magnet synchronous motor as a second line voltage; and the logic operation unit is configured to calculate the temperature characteristic equation based on the first rotator temperature, the first line voltage, the second rotator temperature, the second line voltage and the rated rotating speed.

Preferably, the system for monitoring a temperature of a rotor of a permanent magnet synchronous motor further includes a temperature sensor disposed in a stator core of the permanent magnet synchronous motor and configured to measure the second rotor temperature after the permanent magnet synchronous motor runs at the rated power and the temperature of the permanent magnet synchronous motor is stable.

Preferably, the logic operation unit includes: a first calculation subunit configured to calculate a magnetic linkage expression of the permanent magnet of the permanent magnet synchronous motor based on the first rotor temperature, the first line voltage, the second rotor temperature, the second line voltage and the rated rotating speed; a second calculation subunit configured to calculate magnetic linkage of the permanent magnet at zero degree centigrade according to the magnetic linkage expression; and a third calculation subunit configured to calculate the rotor temperature expression based on the magnetic linkage expression and the magnetic linkage of the permanent magnet.

Preferably, the third calculation subunit includes: a first transformation circuit configured to transform a line voltage expression into a stationary two-phase voltage expression in a stationary two-phase α-β coordinate system; a definition circuit configured to define an extended back electromotive force expression; a second transformation circuit configured to substitute the extended back electromotive force expression into the stationary two-phase voltage expression, and acquire a magnetic linkage expression of the permanent magnet of the rotor by transformation; and a third transformation circuit configured to substitute the magnetic linkage of the permanent magnet into the magnetic linkage expression of the permanent magnet to acquire the rotor temperature expression.

It can be seen from the technical solution described above that, a method and a system for monitoring a temperature of a rotor of a permanent magnet synchronous motor are provided according to the present disclosure, with the method and the system, the a-phase line current and the b-phase line current of the stator of the permanent magnet synchronous motor are acquired as the first line current and the second line current, respectively, the line voltage between the a-phase and the b-phase of the stator is acquired. Then the first line current, the second line current, the line voltage and the inductance parameter of the permanent magnet synchronous motor and the temperature characteristic equation of the permanent magnet of the rotor are substituted into the preset temperature expression for the permanent magnet of the rotor, to calculate the temperature of the rotor. No temperature sensor is pre-embedded into the rotor to monitor the temperature of the permanent magnet of the rotor in the system and the method, thereby avoiding the problem of low system reliability due to the configuration of the temperature sensor to monitor the temperature of the rotor.

In addition, since the temperature of the stator core is not measured in the method and system for monitoring the temperature of the rotor, that is, there is no time delay of thermal conduction between the stator core and the rotor, the temperature of the rotor can be acquired timely, and a magnetic linkage parameter of the permanent magnet can be derived based on the temperature of the rotor, thereby achieving timely protection for the permanent magnet and compensation for the magnetic linkage parameter.

BRIEF DESCRIPTION OF THE DRAWINGS

In order to more clearly illustrate the technical solution in the embodiments of the present disclosure or in the conventional technology, in the following, drawings required in the description of the embodiments or the conventional technology will be introduced simply. Obviously, the drawings in the following description are some embodiments of the disclosure. For those skilled in the art, other drawings can also be obtained according to the drawings without any creative work.

DETAILED DESCRIPTION OF EMBODIMENTS

Technical solutions according to embodiments of the present disclosure are described clearly and completely hereinafter in conjunction with the drawings in the embodiments of the present disclosure. Apparently, the described embodiments are only some embodiments rather than all the embodiments of the present disclosure. Any other embodiments obtained by those skilled in the art based on the embodiments of the present disclosure without any creative work fall in the scope of protection of the present disclosure.

First Embodiment

Figure 1:
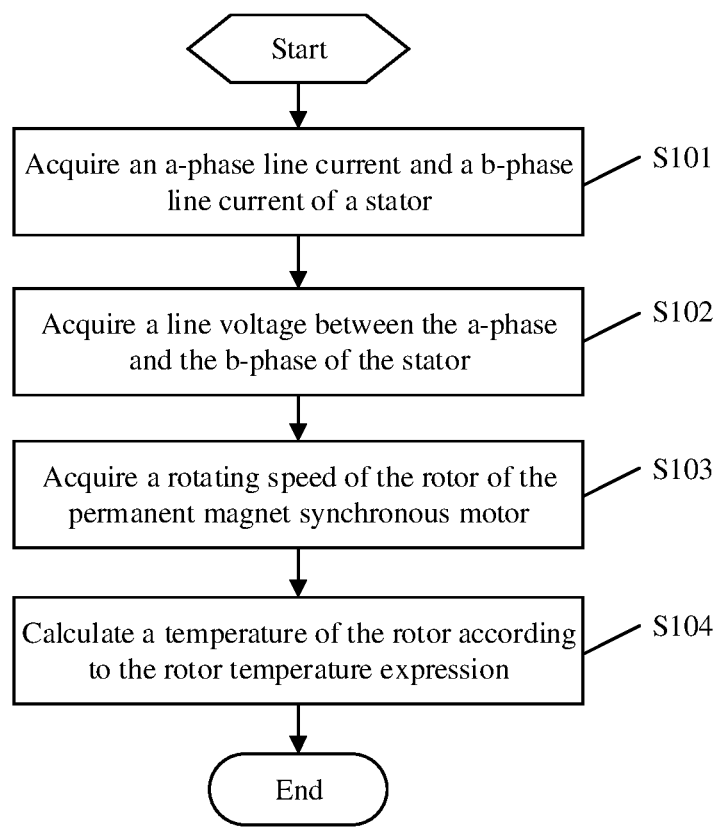
FIG. 1 is a flowchart of a method for monitoring a temperature of a rotor of a permanent magnet synchronous motor according to an embodiment of the present disclosure.

FIG. 1 is a flowchart of a method for monitoring a temperature of a rotor of a permanent magnet synchronous motor according to an embodiment of the present disclosure.

A mathematical model of a steady state of a permanent magnet synchronous motor is established first: a current coordinate transformation formula $$\begin{bmatrix} i_\alpha \\ i_\beta \end{bmatrix} = \begin{bmatrix} 1 & 0 \\ 1/\sqrt{3} & 2/\sqrt{3} \end{bmatrix} \begin{bmatrix} i_a \\ i_b \end{bmatrix} \quad (3\text{-}1)$$

$$\begin{bmatrix} i_d \\ i_q \end{bmatrix} = \begin{bmatrix} \cos\theta_e & \sin\theta_e \\ \cos\theta_e & -\sin\theta_e \end{bmatrix} \begin{bmatrix} i_\alpha \\ i_\beta \end{bmatrix} \quad (3\text{-}2)$$

In order to simplify analysis and reduce the dimension of the equation, a mathematical model of the permanent magnet synchronous motor in a dq synchronously rotating coordinate system is adopted. A magnetic linkage equation and a voltage equation of the permanent magnet synchronous motor in the dp synchronously rotating coordinate system may be represented as:

$$\begin{bmatrix} v_d \\ v_q \end{bmatrix} = \begin{bmatrix} R_m + pL_d & -\omega L_q \\ \omega L_d & R_m + pL_q \end{bmatrix} \begin{bmatrix} i_d \\ i_q \end{bmatrix} + \psi_f \omega \begin{bmatrix} 0 \\ 1 \end{bmatrix} \quad (3\text{-}3)$$

$$\left.\begin{array}{l} \psi_d = \psi_f + L_d \cdot i_d \\ \psi_q = L_q \cdot i_q \\ \psi_s = \sqrt{(\psi_f + L_d \cdot i_d)^2 + (L_q \cdot i_q)^2} \end{array}\right\} \quad (3\text{-}4)$$

where $i_d$, $i_q$, $u_d$, $u_q$, $\psi_d$, $\psi_q$, and $\psi_f$ are components of a stator current, a stator voltage and magnetic linkage in a d axis and in a q axis, and magnetic linkage of a permanent magnet, respectively, $L_d$ and $L_q$ are a direct-axis synchronous inductance and a quadrature-axis synchronous inductance, $\theta_e$ is a position angle of a rotor of a motor, $\omega_e$ is an electrical angular rate of the motor, and $\omega_e = n_p \omega_r$ ($n_p$ is the number of pole pairs of the motor, and $\omega_r$ is a mechanical angular rate of the motor), p is a differential operator, and $$p = \frac{d}{dt}.$$

In a steady state, the voltage equation can be simplified as:

$$u_d = R_s i_d - \omega_e L_q i_q \quad (3\text{-}5)$$

$$u_q = R_s i_q + \omega_e L_d i_d + \omega_e \psi_f \quad (3\text{-}6)$$

According to the analysis described above, as shown in FIG. 1, the method for monitoring the temperature of the rotor according to the embodiment includes steps S101 to S104.

In S101, an a-phase line current and a b-phase line current of the stator are acquired.

In the embodiment, the a-phase line current of the stator of the permanent magnet synchronous motor is acquired as a first line current, and the b-phase line current of stator is acquired as a second line current.

In S102, a line voltage between the a-phase and the b-phase of the stator is acquired.

In S103, a rotating speed of the rotor of the permanent magnet synchronous motor is acquired.

In S104, a temperature of the rotor is calculated according to a rotor temperature expression.

The first line current, the second line current, the line voltage between the a-phase and the b-phase, the rotating speed of the rotor, an inductance parameter of the permanent magnet synchronous motor and a temperature characteristic equation of a permanent magnet of the rotor are substituted into a preset rotor temperature expression, to calculate a temperature of the rotor.

The rotor temperature expression is acquired by steps as follows.

Equation (3-3) is transformed into equations (5-7) and (5-8).

$$\begin{bmatrix} v_d \\ v_q \end{bmatrix} = R \begin{bmatrix} i_d \\ i_q \end{bmatrix} + \begin{bmatrix} pL_d & -\omega_e L_q \\ \omega_e & pL_d \end{bmatrix} \begin{bmatrix} i_d \\ i_q \end{bmatrix} + \begin{bmatrix} 0 & 0 \\ \omega_e(L_d - L_q) & p(L_q - L_d) \end{bmatrix} \begin{bmatrix} i_d \\ i_q \end{bmatrix} + \begin{bmatrix} 0 \\ \psi_f \omega_e \end{bmatrix} \quad (5\text{-}7)$$

$$\begin{bmatrix} v_d \\ v_q \end{bmatrix} = \quad (5\text{-}8)$$

$$R \begin{bmatrix} i_d \\ i_q \end{bmatrix} + \begin{bmatrix} pL_d & -L_q \omega_e \\ L_q \omega_e & pL_d \end{bmatrix} \begin{bmatrix} i_d \\ i_q \end{bmatrix} + \begin{bmatrix} 0 \\ (L_d - L_q)(\omega_e i_d - i_q) + \psi_f \omega_e \end{bmatrix}$$

The equation (5-8) is transformed into a stationary two-phase α-β coordinate system:

$$\begin{bmatrix} v_\alpha \\ v_\beta \end{bmatrix} = R \begin{bmatrix} i_\alpha \\ i_\beta \end{bmatrix} + \begin{bmatrix} pL_d & (L_d - L_q)\omega \\ -(L_d - L_q)\omega_e & pL_d \end{bmatrix} \begin{bmatrix} i_\alpha \\ i_\beta \end{bmatrix} + \lambda \begin{bmatrix} -\sin\theta_e \\ \cos\theta_e \end{bmatrix} \quad (5\text{-}9)$$

$$\text{where } \lambda = (L_d - L_q)(\omega_e i_d - i_q) + \psi_f \omega_e \quad (5\text{-}10)$$

An extended back electromotive force vector is defined as $$\bar{e}_{\alpha\beta} = \begin{bmatrix} \bar{e}_\alpha \\ \bar{e}_\beta \end{bmatrix} = \begin{bmatrix} \lambda \sin\theta_e \\ -\lambda \cos\theta_e \end{bmatrix}.$$

It can be seen from equation (5-10) that the extended back electromotive force vector includes a magnetic linkage component of the permanent magnet of the rotor, therefore, the extended back electromotive force can be calculated according to equation (5-9), and then a magnetic linkage value of the permanent magnet can be derived.

A calculation formula (5-11) for the extended back electromotive force can be acquired according to equation (5-9).

$$\begin{bmatrix} e_\alpha \\ e_\beta \end{bmatrix} = \begin{matrix} (pL_d + R)i_\alpha - v_\alpha + (L_d - L_q)\omega_e i_\beta \\ (pL_d + R)i_\beta - v_\beta + (L_d - L_q)\omega_e i_\alpha \end{matrix} \quad (5\text{-}11)$$

In equation (5-11), $i_\alpha$ and $i_\beta$ can be acquired by measuring $i_a$ and $i_b$ and transforming $i_a$ and $i_b$ according to equation (3-1), $v_\alpha$ and $v_\beta$ are known values outputted from motor vector control, $\omega_e$ is a measured rotating speed of motor, and $L_d$ and $L_q$ are known inductance parameters of the motor.

After the extended back electromotive force is acquired according to equation (5-11), the magnetic linkage of the permanent magnet of the rotor can be extracted according to equation (5-12) as follows.

$$\psi_f = \frac{\lambda - (L_d - L_q)(\omega_e i_d - i_q)}{\omega_e} = \frac{\sqrt{e_\alpha^2 + e_\beta^2} - (L_d - L_q)(\omega_e i_d - i_q)}{\omega_e} \quad (5\text{-}12)$$

In equation (5-12), $i_d$ and $i_q$ can be acquired by measuring $i_a$ and $i_b$ and transforming $i_a$ and $i_b$ according to equation (3-2), $\omega_e$ is a measured rotating speed of motor, and $L_d$ and $L_q$ are known inductance parameters of the motor.

The rotor temperature expression of the permanent magnet of the rotor can be acquired by substituting equation (5-12) into equation (5-6).

$$T_{\varphi_f} = \frac{\varphi_f - \varphi_{f0}}{k_{T\varphi}} = \frac{\sqrt{e_\alpha^2 + e_\beta^2} - (L_d - L_q)(\omega_e i_d - i_q) - \varphi_{f0}}{k_{T\varphi}\omega_e} \quad (5\text{-}13)$$

In equation (5-13) as described above, $i_a$ and $i_b$ are the first line current and the second line current, respectively.

It can be seen from the technical solution described above that, a method and a system for monitoring a temperature of a rotor of a permanent magnet synchronous motor are provided according to the present disclosure. In the method and the system, the a-phase line current and the b-phase line current of the stator of the permanent magnet synchronous motor are acquired as the first line current and the second line current, respectively, and the line voltage between the a-phase and the b-phase of the stator is acquired. Then the first line current, the second line current, the line voltage, the inductance parameter of the permanent magnet synchronous motor and the temperature characteristic equation of the permanent magnet of the rotor are substituted into the preset temperature expression for the permanent magnet of the rotor, to calculate the temperature of the rotor. No temperature sensor is pre-embedded into the rotor to monitor the temperature of the permanent magnet of the rotor in the method, thereby avoiding the problem of low system reliability due to the configuration of the temperature sensor to monitor the temperature of the rotor.

In addition, since the temperature of the stator core is not measured in the method and system for monitoring the temperature of the rotor, that is, there is no time delay of thermal conduction between the stator core and the rotor, the temperature of the rotor can be acquired timely. Furthermore, a magnetic linkage parameter of the permanent magnet can be derived based on the temperature of the rotor, thereby achieving timely protection for the permanent magnet and compensation for the magnetic linkage parameter.

Figure 2:
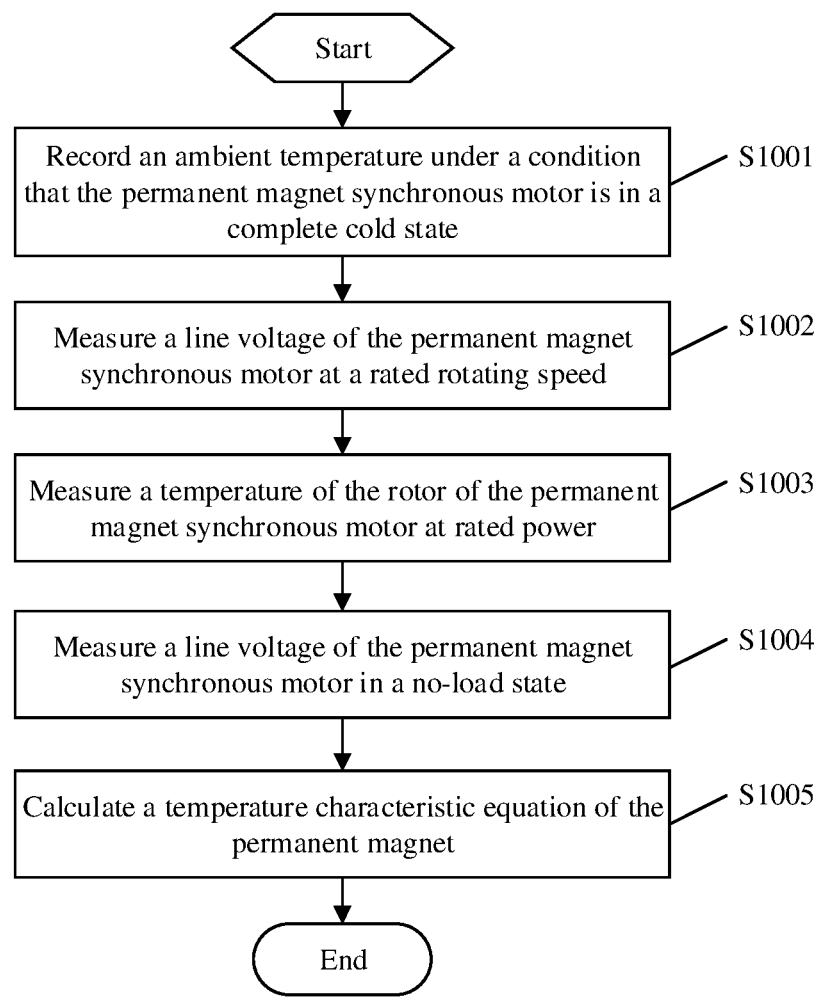
FIG. 2 is a flowchart of a derivation process for a temperature characteristic equation of a permanent magnet according to the present disclosure.

As shown in FIG. 2, the temperature characteristic equation in the embodiment can be acquired by steps as follows.

An amplitude value of no-load back electromotive force of the permanent magnet synchronous motor is directly related to a rotating speed of the rotor, as described in the following equation:

$$\omega_e \psi_f = E_0 = U_a = \frac{U_{ab}}{\sqrt{3}} \quad (5\text{-}1)$$

In equation (5-1), $E_0$, $U_a$ and $U_{ab}$ are respectively an amplitude value of the no-load back electromotive force, a peak value of an a-phase voltage and a peak value of a line voltage of the permanent magnet motor.

Therefore, magnetic linkage of a permanent magnet of a rotor corresponding to a certain temperature can be estimated by measuring a line voltage of the motor at a rated rotating speed at the temperature.

$$\psi_f = \frac{U_{ab}}{\sqrt{3}\,\omega_e} \quad (5\text{-}2)$$

In S1001, an ambient temperature is recorded under a condition that the permanent magnet synchronous motor is in a cold state.

Under a condition that the permanent magnet synchronous motor is in a complete cold state, an ambient temperature of an current environment of the permanent magnet synchronous motor is measured and recorded. Since the permanent magnet synchronous motor is an isothermal body in this case, the ambient temperature is a temperature of the permanent magnet of the rotor.

In S1002, a line voltage of the permanent magnet synchronous motor at a rated rotating speed is measured.

After the permanent magnet synchronous motor is dragged to a rated rotating speed in an open-circuit state, a line voltage of the permanent magnet synchronous motor is measured as a first line voltage.

Temperature rise examination of full power at the rated rotating speed is performed on the permanent magnet motor as a motor, a temperature $T_h$ is recorded by a temperature sensor pre-embedded in the stator of the motor after the temperature of the motor is stable.

In S1003, a temperature of the rotor of the permanent magnet synchronous motor at rated power is measured.

The permanent magnet synchronous motor is run to rated power, a temperature of the stator of the permanent magnet synchronous motor is measured after the temperature of the permanent magnet synchronous motor is stable. In a case that the temperature of the permanent magnet synchronous motor is stable, the entire motor is an isothermal body, and the temperature of the stator is regarded as a second rotor temperature.

In S1004, a line voltage of the permanent magnet synchronous motor in a no-load state is measured.

after the above step, the permanent magnet synchronous motor is made unloaded and the permanent magnet synchronous motor is kept running at a rated rotating speed, and a line voltage of the permanent magnet synchronous motor is measured as a second line voltage, and a temperature coefficient of the permanent magnet in the permanent magnet motor is derived.

$$\psi_{fT_s} = \frac{U_{abT_s}}{\sqrt{3}\,\omega_e}, \quad \psi_{fTh} = \frac{U_{abTh}}{\sqrt{3}\,\omega_e} \quad (5\text{-}3)$$

$$\psi_f = f(T) = \frac{\psi_{fTh} - \psi_{fTs}}{T_h - T_s}(T - T_s) + \psi_{fTs} \quad (5\text{-}4)$$

In S1005, a temperature characteristic equation of the permanent magnet is calculated.

Equations (5-3) and (5-4) are expressions for calculating magnetic linkage of the permanent magnet at a certain temperature based on measurement values.

Magnetic linkage $\psi_{fT0}$ of the permanent magnet of the motor at 0 degree centigrade can be calculated according to equation (5-4), as shown in equation (5-5), and equation (5-4) is further simplified into equation (5-6).

$$\psi_{fT0} = f(0) = \frac{\psi_{fTh} - \psi_{fTs}}{T_h - T_s}(0 - T_s) + \psi_{fTs} \quad (5\text{-}5)$$

$$\psi_f = f(T) = K_{T\psi_f} T + \psi_{fT0} \left( K_{T\psi_f} = \frac{\psi_{fTh} - \psi_{fTs}}{T_h - T_s} \right) \quad (5\text{-}6)$$

Equation (5-6) is the finally obtained temperature characteristic equation of the magnetic linkage of the permanent magnet in the rotor of the permanent magnet motor. It is apparent that a temperature of the permanent magnet can be derived inversely from the magnitude of the magnetic linkage of the permanent magnet in the rotor of the permanent magnet motor at a certain time instant according to equation (5-6).

Second Embodiment

Figure 3:
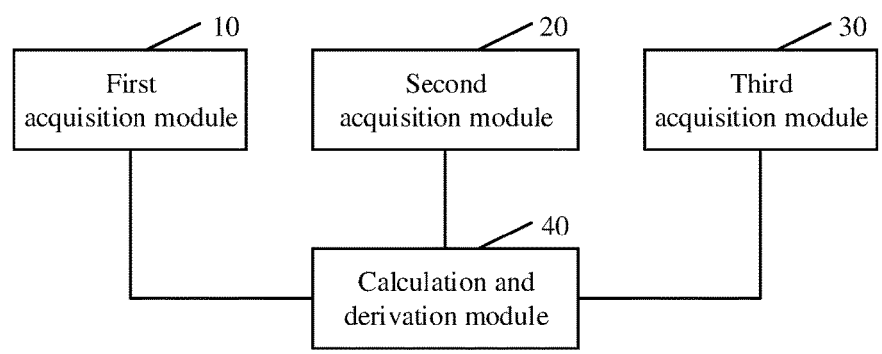
FIG. 3 is a structural diagram of a system for monitoring a temperature of a rotor of a permanent magnet synchronous motor according to another embodiment of the present disclosure.

FIG. 3 is a structural diagram of a system for monitoring a temperature of a rotor of a permanent magnet synchronous motor according to another embodiment of the present disclosure.

As shown in FIG. 3, the permanent magnet synchronous motor according to the embodiment includes a first acquisition module 10, a second acquisition module 20, a third acquisition module 30 and a calculation and derivation module 40.

The first acquisition module 10 is configured to acquire an a-phase line current and a b-phase line current of a stator.

The a-phase line current of the stator of the permanent magnet synchronous motor is acquired as a first line current, and the b-phase line current of the stator of the permanent magnet synchronous motor is acquired as a second line current.

The second acquisition module 20 is configured to acquire a line voltage between the a-phase and the b-phase of the stator.

The third acquisition module 30 is configured to acquire a rotating speed of the rotor of the permanent magnet synchronous motor.

The calculation and derivation module 40 is configured to calculate a temperature of the rotor according to a rotor temperature expression.

That is, the first line current, the second line current, the line voltage between the a-phase and the b-phase and the rotating speed of the rotor which are acquired in above steps, and an inductance parameter of the permanent magnet synchronous motor and a temperature characteristic equation of the permanent magnet of the rotor are substituted into a preset rotor temperature expression, to calculate the temperature of the rotor.

The derivation for the rotor temperature expression and acquisition for the temperature characteristic equation are described in the first embodiment.

It can be seen from the technical solution described above that, a system for monitoring a temperature of a rotor of a permanent magnet synchronous motor is provided according to the present disclosure. With the system, the a-phase line current and the b-phase line current of the stator of the permanent magnet synchronous motor are acquired as the first line current and the second line current, respectively, the line voltage between the a-phase and the b-phase of the stator is acquired. Then, the first line current, the second line current, the line voltage and the inductance parameter of the permanent magnet synchronous motor and the temperature characteristic equation of the permanent magnet of the rotor are substituted into the preset temperature expression for the permanent magnet of the rotor, to calculate the temperature of the rotor. No temperature sensor is pre-embedded into the rotor to monitor the temperature of the permanent magnet of the rotor in the system, thereby avoiding the problem of low system reliability due to the configuration of the temperature sensor to monitor the temperature of the rotor.

In addition, since the temperature of the stator core is not measured in the method for monitoring the temperature of the rotor, that is, there is no time delay of thermal conduction between the stator core and the rotor, the temperature of the rotor can be acquired timely. Furthermore, a magnetic linkage parameter of the permanent magnet can be derived based on the temperature of the rotor, thereby achieving timely protection for the permanent magnet and compensation for the magnetic linkage parameter.

The calculation and derivation module includes: a first detection unit configured to measure and record a current ambient temperature as a first rotor temperature under a condition that the permanent magnet synchronous motor is in a complete cold state; and a second detection unit configured to drag the permanent magnet synchronous motor to a rated rotating speed in an open-circuit state, and measure a line voltage of the permanent magnet synchronous motor as a first line voltage. The first detection unit is further configured to run the permanent magnet synchronous motor to rated power, and measure a temperature of the stator of the permanent magnet synchronous motor as a second rotor temperature after the temperature of the permanent magnet synchronous motor is stable. The second detection unit is further configured to, after the permanent magnet synchronous motor runs at the rated power, make the permanent magnet synchronous motor unloaded and keep the permanent magnet synchronous motor running at a rated rotating speed, and measure a line voltage of the permanent magnet synchronous motor as a second line voltage. The calculation and derivation module includes a logic operation unit configured to calculate the rotor temperature expression based on the first rotator temperature, the first line voltage, the second rotator temperature, the second line voltage and the rated rotating speed.

The logic operation unit includes: a first calculation subunit configured to calculate a magnetic linkage expression of the permanent magnet of the permanent magnet synchronous motor based on the first rotor temperature, the first line voltage, the second rotor temperature, the second line voltage and the rated rotating speed; a second calculation subunit configured to calculate magnetic linkage of the permanent magnet at zero degree centigrade according to the magnetic linkage expression; and a third calculation subunit configured to calculate the rotor temperature expression based on the magnetic linkage expression and the magnetic linkage of the permanent magnet.

The third calculation subunit includes: a first transformation circuit configured to transform a line voltage expression into a stationary two-phase voltage expression in a stationary two-phase α-β coordinate system; a definition circuit configured to define an extended back electromotive force expression; a second transformation circuit configured to substitute the extended back electromotive force expression into the stationary two-phase voltage expression, and acquire a magnetic linkage expression of the permanent magnet of the rotor by transformation; and a third transformation circuit configured to substitute the magnetic linkage of the permanent magnet into the magnetic linkage expression of the permanent magnet to acquire the rotor temperature expression.

In addition, the system further includes a temperature sensor disposed in a stator core of the permanent magnet synchronous motor and configured to measure the second rotor temperature after the permanent magnet synchronous motor runs at the rated power and the temperature of the permanent magnet synchronous motor is stable.

Finally, it should be further noted that the relationship terminologies such as "first", "second" and the like are only used herein to distinguish one entity or operation from another entity and operation, rather than to necessitate or imply that the actual relationship or order exists between the entities or operations. Furthermore, terms of "include", "comprise" or any other variants are intended to be non-exclusive. Therefore, a process, method, article or device including multiple elements includes not only the elements but also other elements that are not enumerated, or also include the elements inherent for the process, method, article or device. Unless expressively limited otherwise, elements defined by the statement "comprising (including) one . . . " does not exclude the case that other similar elements may exist in the process, method, article or device including the elements.

In the present specification, the embodiments are described in progressive manner. Each embodiment mainly focuses on an aspect different from other embodiments, and reference can be made to these similar parts among the embodiments.

The above illustration of the disclosed embodiments enables those skilled in the art to implement or practice the present disclosure. Many changes to these embodiments are apparent for those skilled in the art, and general principles defined herein can be implemented in other embodiments without departing the spirit or scope of the present disclosure. Hence, the present disclosure is not limited to the embodiments disclosed herein, but is in conform to the widest scope consistent with principles and novel features disclosed herein.

The invention claimed is:

1. A method for monitoring a temperature of a rotor of a permanent magnet synchronous motor, comprising:
    acquiring an a-phase line current of a stator of the permanent magnet synchronous motor as a first line current;
    acquiring a b-phase line current of the stator as a second line current;
    acquiring a line voltage between the a-phase and the b-phase of the stator;
    acquiring a rotating speed of the rotor of the permanent magnet synchronous motor;
    substituting the first line current, the second line current, the line voltage, the rotating speed, an inductance parameter of the permanent magnet synchronous motor and a temperature characteristic equation of a permanent magnet of the rotor into a preset rotor temperature expression, to calculate the temperature of the rotor,
    wherein the temperature characteristic equation is acquired by steps of:
    measuring and recording a current ambient temperature as a first rotor temperature under a condition that the permanent magnet synchronous motor is in a complete cold state;
    dragging the permanent magnet synchronous motor to a rated rotating speed in an open-circuit state, and measuring a line voltage of the permanent magnet synchronous motor as a first line voltage;
    running the permanent magnet synchronous motor to rated power, and measuring a temperature of the stator of the permanent magnet synchronous motor as a second rotor temperature after the temperature of the permanent magnet synchronous motor is stable;
    after measuring the second rotor temperature, making the permanent magnet synchronous motor unloaded and keeping the permanent magnet synchronous motor running at a rated rotating speed, and measuring a line voltage of the permanent magnet synchronous motor as a second line voltage; and
    deriving the temperature characteristic equation from the first rotator temperature, the first line voltage, the second rotator temperature, the second line voltage and the rated rotating speed.

2. The method for monitoring a temperature of a rotor of a permanent magnet synchronous motor according to claim 1, wherein the running the permanent magnet synchronous motor to rated power and measuring the temperature of the stator of the permanent magnet synchronous motor as the second rotor temperature after the temperature of the permanent magnet synchronous motor is stable comprises:
    running the permanent magnet synchronous motor at the rated power; and
    measuring, by a temperature sensor pre-embedded in a stator core of the permanent magnet synchronous motor, the temperature of the stator as the second rotor temperature after the temperature of the permanent magnet synchronous motor is stable.

3. The method for monitoring a temperature of a rotor of a permanent magnet synchronous motor according to claim 1, wherein the deriving the rotor temperature expression from the first rotator temperature, the first line voltage, the second rotator temperature, the second line voltage and the rated rotating speed comprises:
    calculating a magnetic linkage expression of the permanent magnet of the permanent magnet synchronous motor based on the first rotator temperature, the first line voltage, the second rotator temperature, the second line voltage and the rated rotating speed;
    calculating magnetic linkage of the permanent magnet at zero degree centigrade according to the magnetic linkage expression; and
    calculating the rotor temperature expression based on the magnetic linkage expression and the magnetic linkage of the permanent magnet.

4. The method for monitoring a temperature of a rotor of a permanent magnet synchronous motor according to claim 3, the calculating the rotor temperature expression based on the magnetic linkage expression and the magnetic linkage of the permanent magnet comprises:

transforming a line voltage expression into a stationary two-phase voltage expression in a stationary two-phase α-β coordinate system;

defining an extended back electromotive force expression;

substituting the extended back electromotive force expression into the stationary two-phase voltage expression, and acquiring a magnetic linkage expression of the permanent magnet of the rotor by transformation; and substituting the magnetic linkage of the permanent magnet into the magnetic linkage expression of the permanent magnet to acquire the rotor temperature expression.

5. A system for monitoring a temperature of a rotor of a permanent magnet synchronous motor, comprising:

a first current sensor configured to acquire an a-phase line current of a stator of the permanent magnet synchronous motor as a first line current;

a second current sensor configured to acquire a b-phase line current of the stator as a second line current;

a voltage sensor configured to acquire a line voltage between the a-phase and the b-phase of the stator;

a tachometer configured to acquire a rotating speed of the rotor of the permanent magnet synchronous motor; and a calculation and derivation module configured to substitute the first line current, the second line current, the line voltage, the rotating speed, an inductance parameter of the permanent magnet synchronous motor and a temperature characteristic equation of a permanent magnet of the rotor into a preset rotor temperature expression, to calculate the temperature of the rotor, wherein the calculation and derivation module comprises:

a first detection unit, a second detection unit, and a logic operation unit, wherein the first detection unit is configured to measure and record a current ambient temperature as a first rotor temperature under a condition that the permanent magnet synchronous motor is in a complete cold state;

the second detection unit is configured to drag the permanent magnet synchronous motor to a rated rotating speed in an open-circuit state, and measure a line voltage of the permanent magnet synchronous motor as a first line voltage;

the first detection unit is further configured to run the permanent magnet synchronous motor to rated power, and measure a temperature of the stator of the permanent magnet synchronous motor as a second rotor temperature after the temperature of the permanent magnet synchronous motor is stable;

the second detection unit is further configured to, after the permanent magnet synchronous motor runs at the rated power, make the permanent magnet synchronous motor unloaded and keep the permanent magnet synchronous motor running at a rated rotating speed, and measure a line voltage of the permanent magnet synchronous motor as a second line voltage; and the logic operation unit is configured to calculate the temperature characteristic equation based on the first rotator temperature, the first line voltage, the second rotator temperature, the second line voltage and the rated rotating speed.

6. The system for monitoring a temperature of a rotor of a permanent magnet synchronous motor according to claim 5, further comprising:

a temperature sensor disposed in a stator core of the permanent magnet synchronous motor and configured to measure the second rotor temperature after the permanent magnet synchronous motor runs at the rated power and the temperature of the permanent magnet synchronous motor is stable.

7. The system for monitoring a temperature of a rotor of a permanent magnet synchronous motor according to claim 5, wherein the logic operation unit comprises:

a first calculation subunit configured to calculate a magnetic linkage expression of the permanent magnet of the permanent magnet synchronous motor based on the first rotor temperature, the first line voltage, the second rotor temperature, the second line voltage and the rated rotating speed;

a second calculation subunit configured to calculate magnetic linkage of the permanent magnet at zero degree centigrade according to the magnetic linkage expression; and a third calculation subunit configured to calculate the rotor temperature expression based on the magnetic linkage expression and the magnetic linkage of the permanent magnet.

8. The system for monitoring a temperature of a rotor of a permanent magnet synchronous motor according to claim 7, wherein the third calculation subunit comprises:

a first transformation circuit configured to transform a line voltage expression into a stationary two-phase voltage expression in a stationary two-phase α-β coordinate system;

a definition circuit configured to define an extended back electromotive force expression;

a second transformation circuit configured to substitute the extended back electromotive force expression into the stationary two-phase voltage expression, and acquire a magnetic linkage expression of the permanent magnet of the rotor by transformation; and a third transformation circuit configured to substitute the magnetic linkage of the permanent magnet into the magnetic linkage expression of the permanent magnet to acquire the rotor temperature expression.

* * * * *